(12) United States Patent
Mazzocco et al.

(10) Patent No.: US 11,545,347 B2
(45) Date of Patent: Jan. 3, 2023

(54) INTERNALLY DIVISIBLE PROCESS CHAMBER USING A SHUTTER DISK ASSEMBLY

(71) Applicant: Applied Materials, Inc., Santa Clara, CA (US)

(72) Inventors: John Joseph Mazzocco, San Jose, CA (US); Anantha K. Subramani, San Jose, CA (US); Yang Guo, San Mateo, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 17/183,587

(22) Filed: Feb. 24, 2021

(65) Prior Publication Data

US 2022/0139684 A1   May 5, 2022

Related U.S. Application Data

(60) Provisional application No. 63/109,939, filed on Nov. 5, 2020.

(51) Int. Cl.
*H01J 37/34* (2006.01)
*C23C 14/34* (2006.01)
(Continued)

(52) U.S. Cl.
CPC .......... *H01J 37/3411* (2013.01); *C23C 14/14* (2013.01); *C23C 14/3407* (2013.01);
(Continued)

(58) Field of Classification Search
None
See application file for complete search history.

(56) References Cited

U.S. PATENT DOCUMENTS

| 6,136,168 A | 10/2000 | Masujima et al. |
| 6,869,500 B2 | 3/2005 | Lee et al. |

(Continued)

FOREIGN PATENT DOCUMENTS

JP   06-291375 A   10/1994

OTHER PUBLICATIONS

International Search Report for PCT/US2021/052153, dated Dec. 29, 2021.

*Primary Examiner* — Jason Berman
(74) *Attorney, Agent, or Firm* — Moser Taboada (57) ABSTRACT

Apparatus and methods for forming and using internally divisible physical vapor deposition (PVD) process chambers using shutter disks are provided herein. In some embodiments, an internally divisible process chamber may include an upper chamber portion having a conical shield, a conical adaptor, a cover ring, and a target, a lower chamber portion having a substrate support having inner and outer deposition rings, and wherein the substrate support is vertically movable, and a shutter disk assembly configured to internally divide the process chamber and create a separate sealed deposition cavity and a separate sealed oxidation cavity, wherein the shutter disk assembly includes one or more seals disposed along its outer edges and configured to contact at least one of the conical shield, the conical adaptor, or the deposition rings to form the separate sealed deposition and oxidation cavities.

15 Claims, 8 Drawing Sheets

(51) Int. Cl.
*C23C 14/50* (2006.01)
*C23C 14/14* (2006.01)
*H01J 37/32* (2006.01)
*C23C 14/58* (2006.01)

(52) U.S. Cl.
CPC .......... *C23C 14/50* (2013.01); *C23C 14/5853* (2013.01); *H01J 37/3244* (2013.01); *H01J 37/32513* (2013.01); *H01J 37/32899* (2013.01); *H01J 2237/332* (2013.01)

(56) References Cited

U.S. PATENT DOCUMENTS

| | | |
|---|---|---|
| 9,252,002 B2 | 2/2016 | Tsai et al. |
| 2005/0269030 A1 | 12/2005 | Kent et al. |
| 2014/0272684 A1* | 9/2014 | Hofmann ................. G03F 7/16 430/5 |
| 2015/0206714 A1 | 7/2015 | Yamaguchi et al. |
| 2018/0073150 A1* | 3/2018 | Subramani .......... H01L 21/2855 |
| 2018/0138009 A1* | 5/2018 | Sugaya ................... H01J 37/28 |
| 2019/0348264 A1 | 11/2019 | Tsai et al. |

\* cited by examiner

INTERNALLY DIVISIBLE PROCESS CHAMBER USING A SHUTTER DISK ASSEMBLY

CROSS-REFERENCE TO RELATED APPLICATIONS

This application claims benefit of U.S. provisional patent application Ser. No. 63/109,939, filed Nov. 5, 2020 which is herein incorporated by reference in its entirety.

FIELD

Embodiments of the present disclosure generally relate to internally divisible Physical vapor deposition (PVD) process chambers using shutter disks.

BACKGROUND

There is a need to repeatably deposit high uniformity films, for example, Magnesium Oxide (MgO) films among others, in a single process chamber. Depositing Mg and then oxidizing it in a single PVD chamber, for example, has poor substrate-to-substrate repeatability because most of the oxygen for oxidizing the substrate is used up oxidizing the targets and shields in the chamber. The amount of oxygen used on the target and shields depends on chamber conditions, therefore the amount of oxygen available for each substrate can vary greatly.

Typically, in order to produce very repeatable layers of oxidized Mg, Mg is deposited in one chamber and the substrate is then moved to another chamber to oxidize the Mg film. This sequence may require multiple layers, for example, as many as 12 layers of MgO, and has extremely low throughput.

Thus, the inventors have provided embodiments of internally divisible process chambers to allow film deposition and oxidation/gas reactions on substrates to occur within a single process chamber without reacting with other deposited surfaces in chamber.

SUMMARY

Apparatus and methods for forming and using internally divisible physical vapor deposition (PVD) process chambers using shutter disks are provided herein. In some embodiments, an internally divisible process chamber may include an upper chamber portion having a conical shield, a conical adaptor, a cover ring, and a target, a lower chamber portion having a substrate support having inner and outer deposition rings, and wherein the substrate support is vertically movable, and a shutter disk assembly configured to internally divide the process chamber and create a separate sealed deposition cavity and a separate sealed oxidation cavity, wherein the shutter disk assembly includes one or more seals disposed along its outer edges and configured to contact at least one of the conical shield, the conical adaptor, or the deposition rings to form the separate sealed deposition and oxidation cavities.

In some embodiments, a method for forming metal oxide layers on a substrate in a single internally divisible process chamber having an upper chamber and a lower chamber may include moving the substrate into a deposition position within a deposition cavity formed in the single internally divisible process chamber, depositing a metal film from a target onto the substrate, lowering the substrate into the lower chamber, creating a seal using a shutter disk assembly to divide the process chamber into an upper deposition cavity and a lower oxidation cavity, wherein the substrate is within the lower oxidation cavity, oxidizing the metal film deposited on the substrate by introducing oxygen into the oxidation cavity, purging the oxidation cavity to remove residual oxygen, and opening the chamber dividing seal.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of internally divisible substrate processing chambers to allow gas reactions on substrates without reacting other deposited surfaces in the chambers are provided herein. The inventive processing chambers and associated components allow in-situ gas reaction with on-substrate films while preventing other deposited surfaces in the chamber from reacting with the same gas(es). The inventive chamber designs can advantageously segregate and seal the substrate in a smaller internal cavity for gas reactions. That internal cavity is the pumped and purged to remove all reactive gas before unsealing. The substrate can receive multiple layers of deposition and reaction, all within the single process chamber.

The inventive chamber designs can be internally divisible in different ways using various different chamber components and shutter disk assembly embodiments as described below in more detail.

Figure 1:
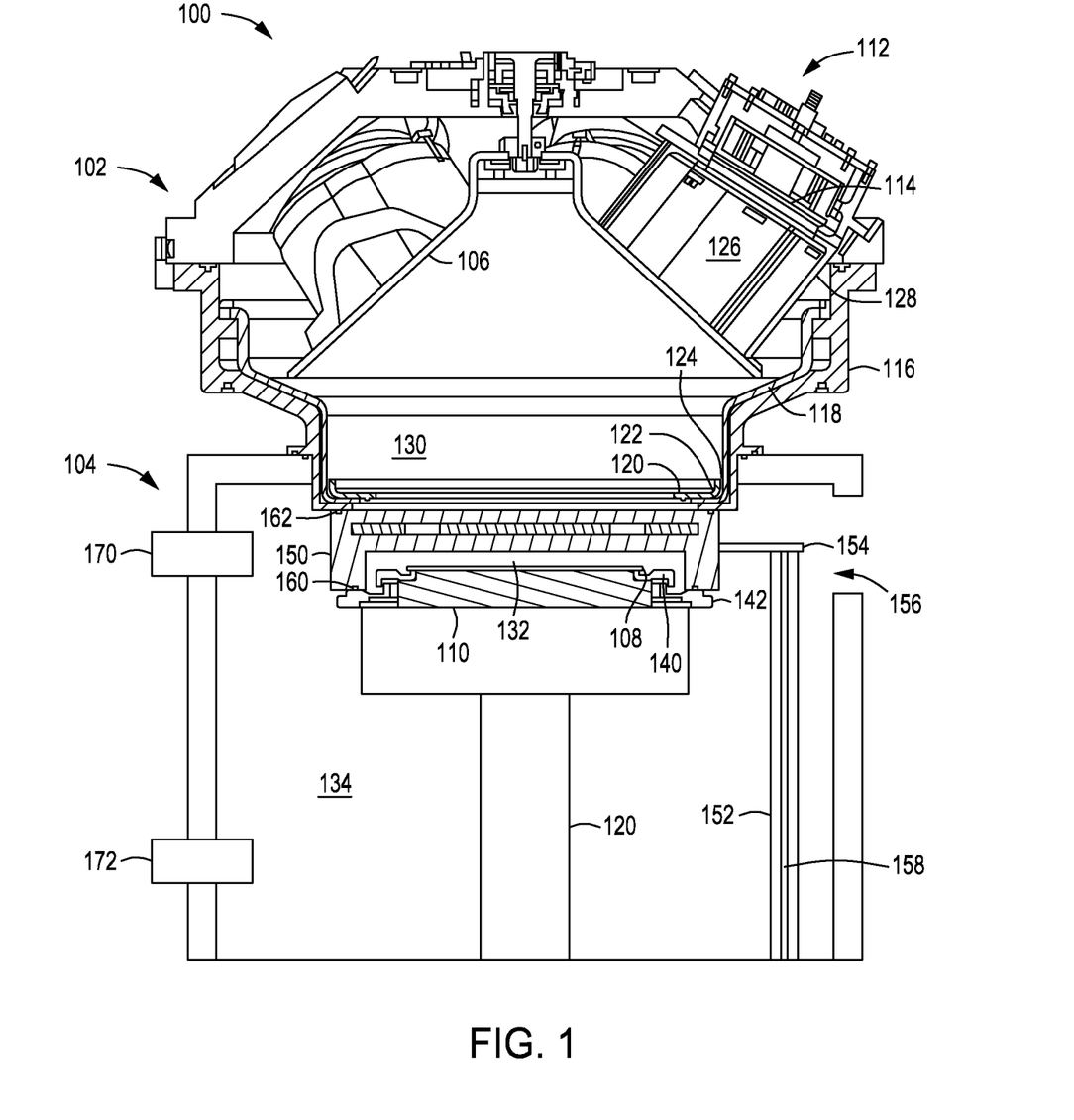
FIG. 1 depicts a cross-sectional view of an internally divisible processing chamber in accordance with some embodiments of the present disclosure.

FIG. 1 depicts a schematic cross-sectional view of a processing chamber (process chamber 100) in accordance with some embodiments of the present disclosure. In some embodiments, the chamber 100 may be multi-cathode PVD chamber. The process chamber 100 includes an upper chamber 102 and a lower chamber 104. The lower chamber 104 includes a substrate support 110 disposed within the process chamber 100 that is configured to support a substrate 108. In some embodiments, the substrate support 110 may be a rotating pedestal. In some embodiments, the substrate support 110 may be vertically movable.

The upper chamber includes a power supply 112 may be coupled to each of the plurality of cathodes 102. The power supply 112 may include direct current (DC), pulsed DC, or radio frequency (RF) power. The rotatable shield 106 may expose two or more of the plurality of cathodes 102 and shield remaining cathodes 102 from cross-contamination during sputtering. The cross-contamination results from physical movement or transfer of a deposition material from one of the cathodes 102 to another one of the cathodes 102. Each cathode 102 is positioned over a corresponding target 114. To sputter the selected target, the rotatable shield 106 is rotated to expose the selected target to be sputtered. The targets 114 may be formed of any material desired to be sputtered onto the substrate 108. In some embodiments, the upper chamber 102 includes a shroud 126, which is a long tube 128 that does not block a line of sight from the target 114 to a substrate disposed on the substrate support 110, corresponding to each cathode 102.

The upper chamber 102 further includes a conical adapter 116 and a conical shield 118. A top section of the conical shield 118 is configured to surround a lower portion of the rotatable shield 106 and a bottom section of the conical shield 118 is configured to surround the substrate support 110 when the substrate support is moved vertically upward into the upper chamber for substrate processing. Before the substrate 108 moves into or out of the chamber, the substrate support 110 can move below a conical shield 118 disposed on a lower portion of the process chamber. A cover ring 120 is disposed on top of the conical shield 118 and surrounds the substrate 108. When the substrate support 110 moves down, the substrate 108 can be lifted up with a robotic arm (not shown) before the substrate 108 moves out of the chamber.

The cover ring 120 can include a ring portion 122 that curves up and has a predefined thickness to form a dish or bowl in which the substrate can be disposed with the ring portion 122 surrounding and disposed above the substrate 108. The cover ring 120 can also include a predefined gap 124 and a predefined length with respect to the conical shield 118. Thus, when materials are deposited on the substrate 108, the materials are prevented or substantially prevented from depositing below the substrate support 110 or outside of the conical shield 118. Controlling the deposition of materials as described advantageously prevents or reduces the spread of contaminants to the substrate 108 or within the process chamber. The inner and outer deposition rings 140, 142 further prevent deposition of the material below the substrate support 110.

When the chamber 100 is not performing depositions processes to deposit material on the substrate 108, the substrate support is lowered into the lower chamber 104 to perform oxidations processes to oxidize the material deposited on the substrate from the target 114, for example Mg. In order to produce very repeatable layers of oxidized Mg or other gas reactions without reacting other deposited surfaces in the chamber, a shutter disk assembly 150 is used to internally divides various volumes/cavities to perform the desired processing. In some embodiments, the shutter disk assembly 150 may be a single piece flat plate or it may be a multi-layer showerhead have internal conduits and gas distribution channels to evenly distribute gases provide to it.

The shutter disk assembly 150 may be moved into place via a robot transfer assembly 152 which can rotate to move the shutter disk assembly 150 into the chamber through a shutter disk opening 156 in the chamber. The robot transfer assembly 152 may include an arm 154 that supports the shutter disk assembly 150. In some embodiments, the shutter disk assembly 150 may be removably coupled to the arm 154 or may just by support by the arm 154.

In at least one embodiment, a seal can be created between the shutter disk assembly 150 and chamber features such as a bottom portion of a conical adapter 116 of the upper housing, or the conical shield 118 disposed in the upper housing. The shutter disk may include one more seals 160, 162 (e.g., an O-ring, or other type of seal) placed at its outer edges that contacts other chamber components to form a seal and create separated cavities. For example, the shutter disk assembly 150 may include an upper seal 162 that forms a seal between the shutter disk assembly 150 and the conical adaptor 116 or conical shield 118. In addition, the shutter disk assembly 150 may include a lower seal 160 that forms a seal between the shutter disk assembly 150 and the outer deposition ring 142. The substrate remains on the substrate support, for example on an electro-static chuck, below the shutter disk. The pedestal then moves up, creating a seal between the shutter disk outer edge and the lower lip of the conical adapter or shield of the upper housing of the process chamber. This divides the chamber 100 and forms a deposition cavity 130, an oxidation cavity 132, and a third cavity 134.

When the shutter disk assembly 150 is moved into place to divide the chamber and perform an oxidation process, for example, Oxygen ($O_2$) can be introduced into the oxidation cavity 132 through a first gas conduit 158. In some embodiments, the first gas conduit 158 may be disposed within the shaft of the robot transfer assembly 152 as shown in FIG. 1. The $O_2$ would then flow through the arm 154 which would be coupled to an inlet in the shutter disk assembly 150. In some embodiments, the shutter disk assembly may act as a showerhead as shown and described with respect to FIG. 3. In other embodiments, the processing gas (e.g., $O_2$) can be introduced through a conduit directly coupled to the shutter disk assembly 150 when it is moved into place for oxidation processing.

When it is time to clear the process chamber 100 of the processing gas (e.g., $O_2$), an inert gas such as Argon may be introduced into the chamber via inlet 170 and gases by be exhausted through outlet 172 using a pump (not shown). In some embodiments, the same conduit (e.g., the first gas conduit 158) used to introduce the processing gas may be used to introduce the inert cleaning gas (e.g., Ar) to clear out the processing gas.

Figure 2:
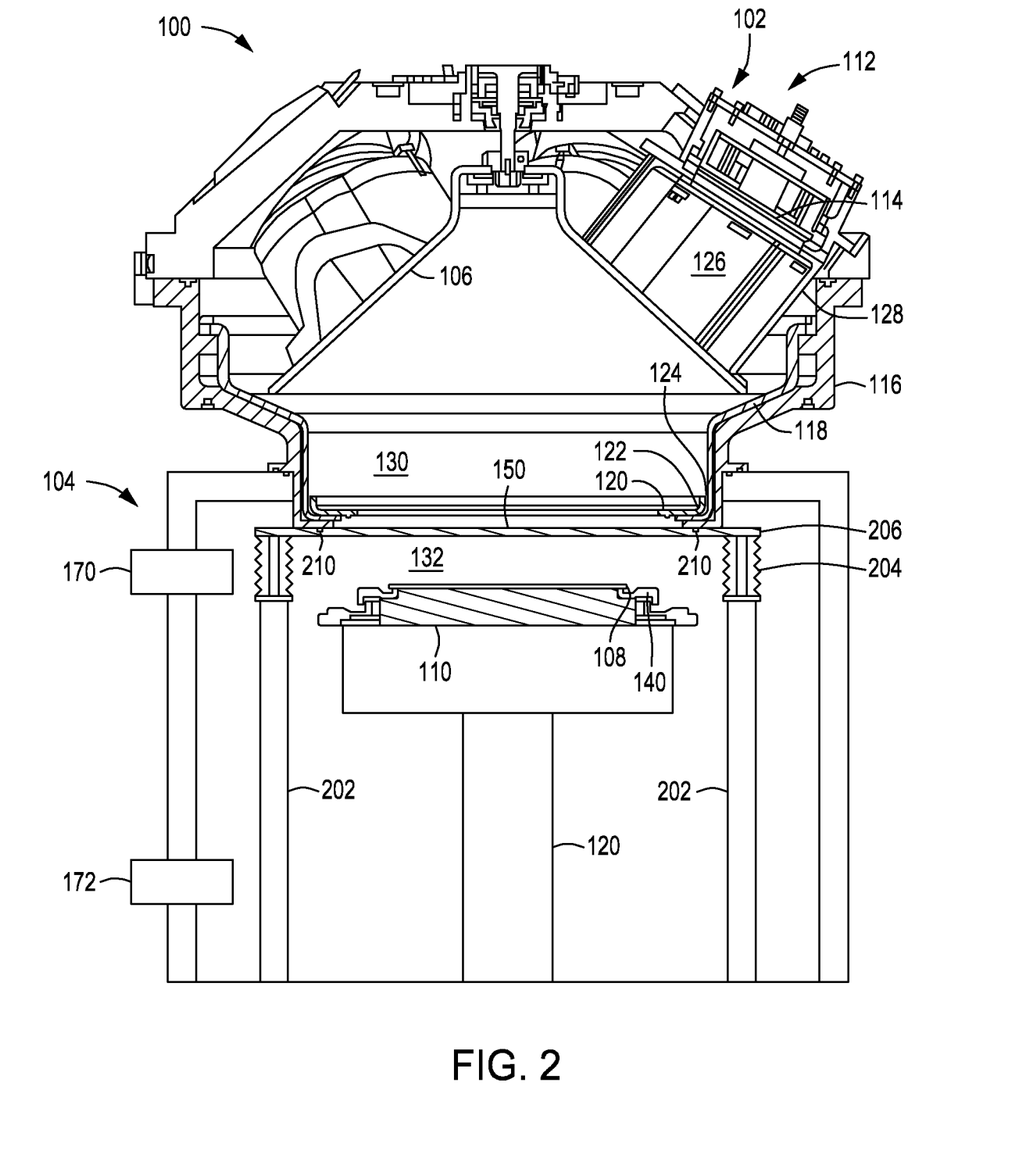
FIG. 2 depicts another embodiment of an internally divisible processing chamber using a shutter disk assembly in accordance with some embodiments of the present disclosure.

FIG. 2 depicts another embodiment of how the chamber can be internally divided using a shutter disk assembly 150. In embodiments consistent with FIG. 2, instead of the substrate support pedestal 110 moving up to form the shutter disk seal and divide the chamber, the shutter disk assembly 150 is moved into place by using one or more chamber-mounted actuators 202 to lift the shutter disk assembly 150 and form a seal between the shutter disk assembly 150 and the conical adapter 116 or shield 118. In some embodiments, there may be a three chamber-mounted actuators 202 to ensure the disk is held level and form a proper seal. Each chamber mounted actuator 202 includes bellows 204 and a support arm 206. As shown in FIG. 2, the shutter disk assembly 150 may be a flat plate having seals 210 (e.g., O-rings or the like) disposed on a top surface to from the seal with the conical adapter 116 or shield 118. In the embodiments, shown in FIG. 2, two cavities are formed when the shutter disk assembly 150 is moved into place for oxidation processing of the substrate; the deposition cavity 130 which is protected from lower chamber oxidation process performed in oxidation cavity 132.

In embodiments consistent with FIG. 2, once this seal is created, a processing gas such as Oxygen ($O_2$) can be introduced into the lower portion of the chamber through the standard gas inlet 170 to oxidize the deposited film on substrate, and later pumped out through outlet 172 using a standard chamber pump. The processing gas may be cleared out of the chamber as discussed above with respect to FIG. 1.

Figure 3:
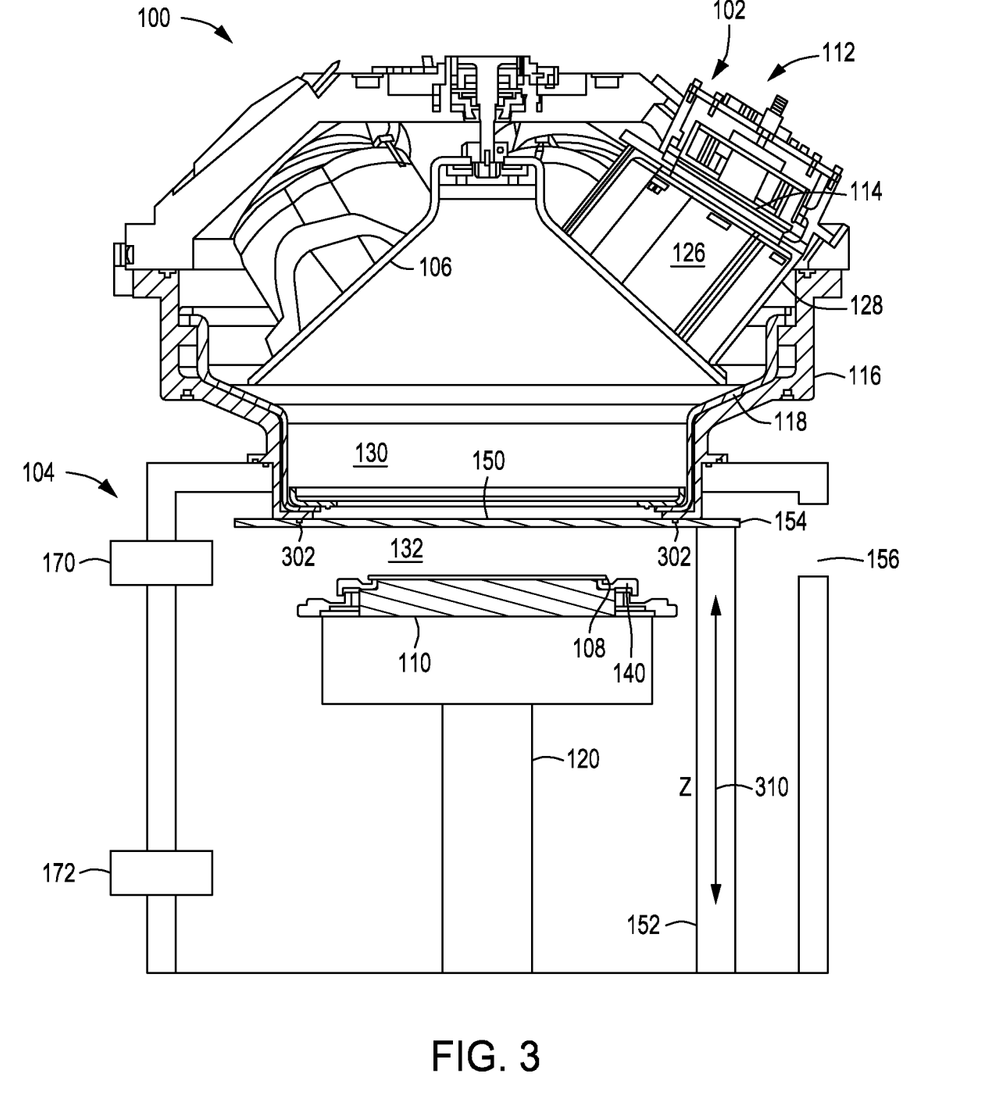
FIG. 3 depicts another embodiment of an internally divisible processing chamber using a shutter disk assembly in accordance with some embodiments of the present disclosure.

FIG. 3 depicts another embodiment of how the chamber can be internally divided using a shutter disk assembly. In embodiments consistent with FIG. 3, the robot transfer assembly 152, which can rotate to move the shutter disk assembly 150 into the chamber through a shutter disk opening 156 in the chamber, is also able to move vertically in a Z direction 310. A seal between shutter disk assembly 150 and the conical adapter 116 or shield 118 is formed as described above via O-ring seals 302. Once shutter disk assembly 150 is in the upper position, $O_2$ or other processing gases can be flowed into and pumped of the oxidation cavity 132 without getting any into deposition area 130.

In embodiments consistent with FIG. 3, the shutter disk assembly 150 is larger than pedestal 110 so that substrate 108 on pedestal 110 could still pass through the bottom opening in conical shield 118. In some embodiments, the shutter disk assembly 150 and arm 154 could be one-piece divider plate.

Figure 4:
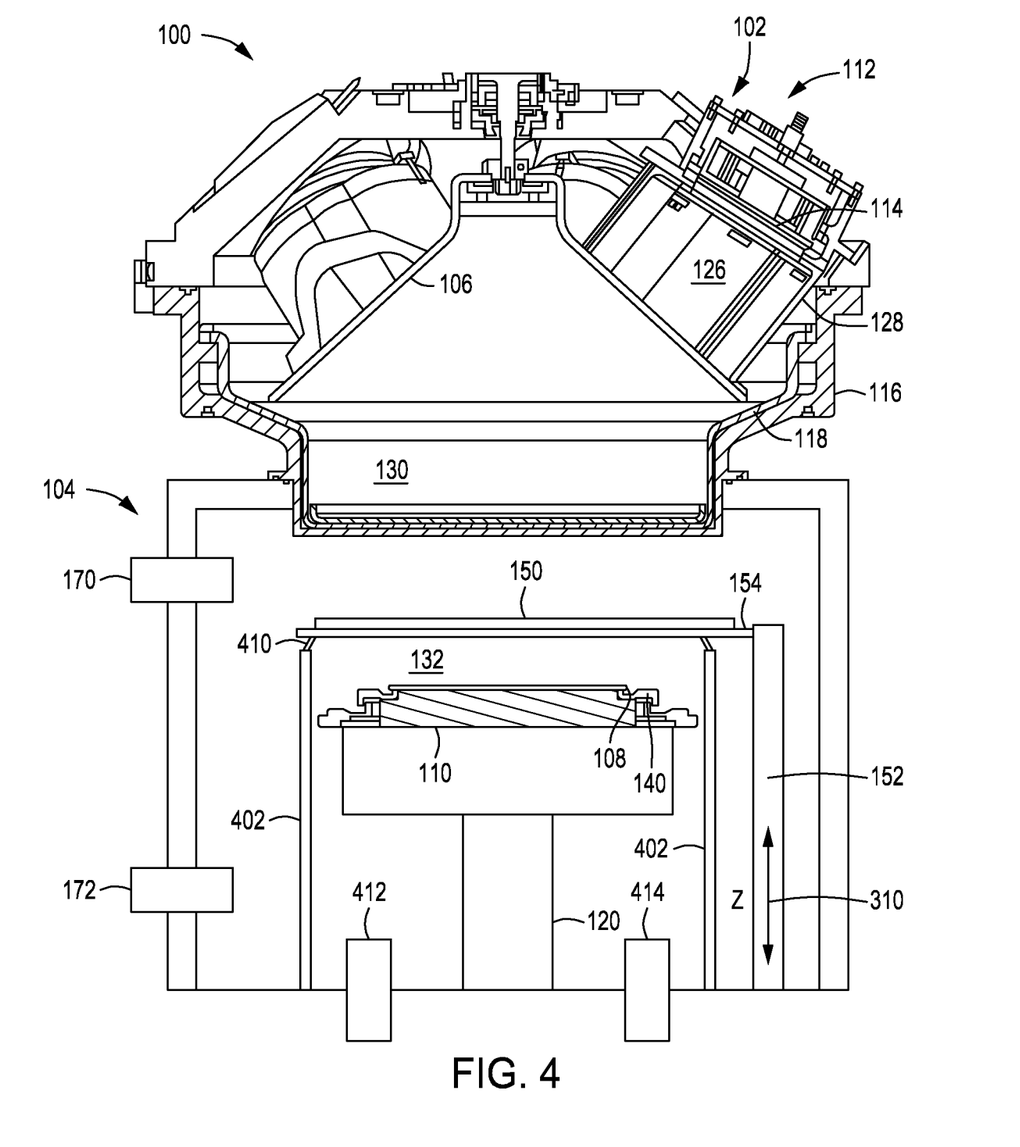
FIG. 4 depicts another embodiment of an internally divisible processing chamber using a shutter disk assembly in accordance with some embodiments of the present disclosure.

FIG. 4 depicts another embodiment of how the chamber can be internally divided using a shutter disk assembly. Similar to embodiments described with respect to FIG. 3, the robot transfer assembly 152 able to move vertically in a Z direction 310. However, in embodiments consistent with FIG. 4, the shutter disk assembly 150 is lowered onto one or more support posts 402 to form oxidation cavity 132 which is separated from deposition cavity 130. A seal is formed using O-rings as described above, or using a simple lip seal 410. In some embodiments, a processing gas such as Oxygen ($O_2$) can be introduced into the lower portion of the chamber through the standard gas inlet 412 located at the bottom of the chamber within the oxidation cavity 132 to oxidize the deposited film on substrate, and later pumped out through outlet 414, also within at the bottom of the chamber within the oxidation cavity 132, using a standard chamber pump.

Figure 5A:
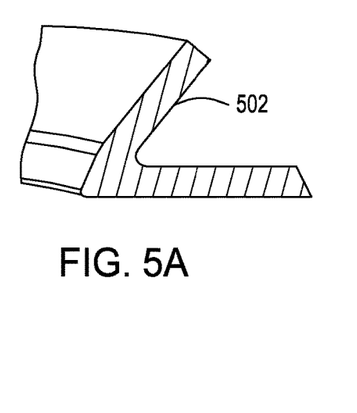
FIGS. 5A and 5B depict cross-section views of a lip structure for a shutter disk assembly in accordance with some embodiments of the present disclosure.
Figure 5B:
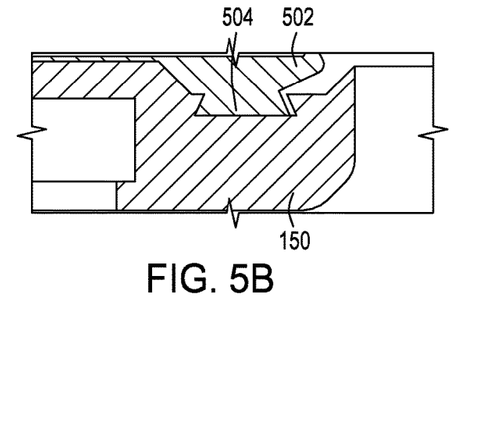

In any of the embodiments discussed with respect to FIGS. 1-4, instead of a tight seal using O-rings (e.g., seals 160, 162, 210, 302), some other type of simple lip seal (e.g., 410), or a seal formed by minimal direct contact between the shutter disk and the conical adapter 116 or shield 118, may be used if a low gas pressure difference is maintained when performing oxidation processes or other gas processes. In some embodiments, an annular lip seal 502 having a cross-section as shown in FIGS. 5A and 5B is disposed within a top groove 504 formed on a top and/or bottom surface of the shutter disk assembly 150.

Figure 6A:
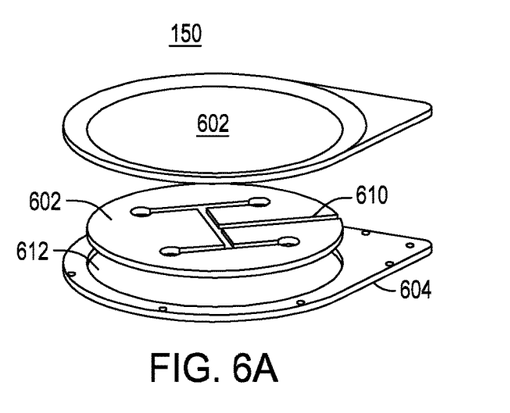
FIGS. 6A-6C depict a gas distribution shutter disk assembly in accordance with some embodiments of the present disclosure.
Figure 6B:
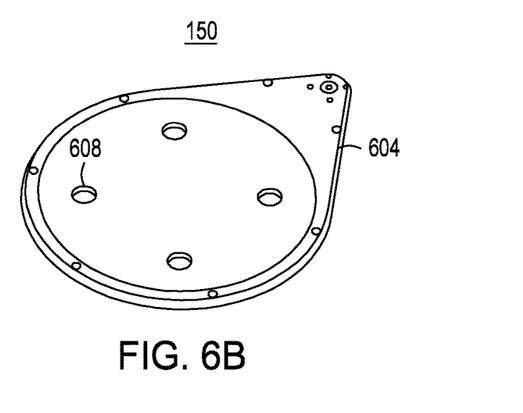
Figure 6C:
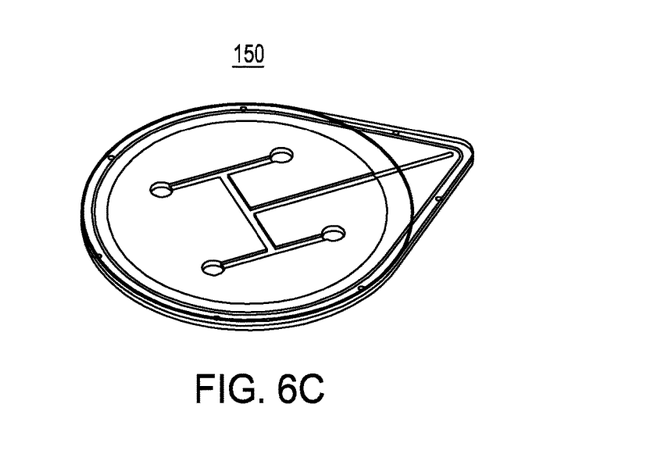

As discussed with respect to FIG. 1, the shutter disk assembly 150 may itself be a showerhead, and oxygen to a distribution disk shower head can be supplied through the actuator mechanism. This is shown in more detail in FIGS. 6A-6C. In some embodiments, the gas distribution shutter disk assembly 150 may include a top plate 602 and a bottom plate 604 with a gas distribution disk 606 disposed between them. The bottom plate 604 may include a central opening and a lip 612 on which the gas distribution disk 606 sits on and is retained within. The gas distribution disk 606 may include a plurality of gas distribution holes 608 coupled to one or more channels 610. At least one of the channels 610 formed in the gas distribution disk 606 couples to a channel formed in either the top plate 602 or the bottom plate 604 which is then coupled to a gas source. For example, the gas source may be a gas supplying conduit formed in the shutter disk robot transfer arm 154 or some other gas supplying conduit.

Figure 7A:
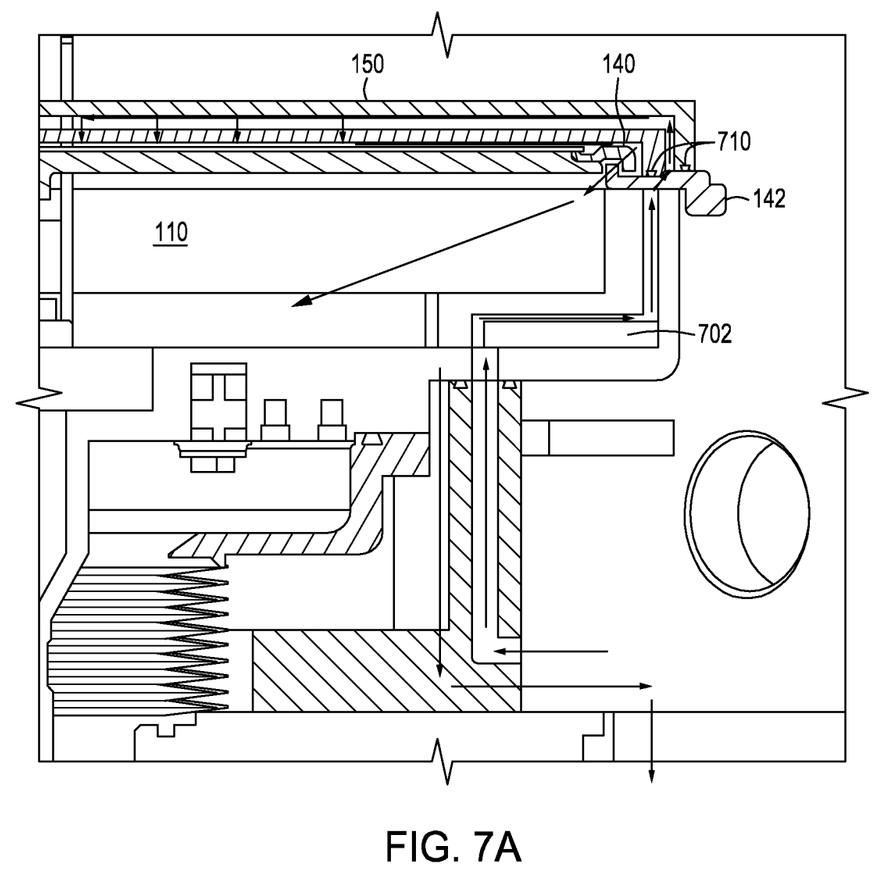
FIGS. 7A and 7B depict additional embodiments of an internally divisible processing chamber using a shutter disk assembly in accordance with some embodiments of the present disclosure.

FIGS. 7A and 7B depicts other embodiments of how the chamber can be internally divided using a shutter disk assembly. In some embodiments consistent with FIG. 7A, a seal between a shutter disk assembly 150 and the rotating pedestal outer support cover ring 142, which can include a ring portion that curves up and has a predefined thickness to form a dish or bowl in which the substrate can be disposed with the ring portion surrounding and disposed above the substrate (also referred to as a dish or bowl). O-ring seals 710 may be used to create the seal. In these embodiments, a shutter disk is attached to the underside of the shutter arm. The shutter disk is rotated into position and the shutter disk forms a seal with the dish creating a small volume within the pedestal cavity containing both the ESC and substrate. O2 is introduced into this small volume through the shutter arm or other gas-supply features in the chamber. The O2 is later pumped out through the pedestal, using features such as the unused backside gas feedthrough to the ESC.

Figure 7B:
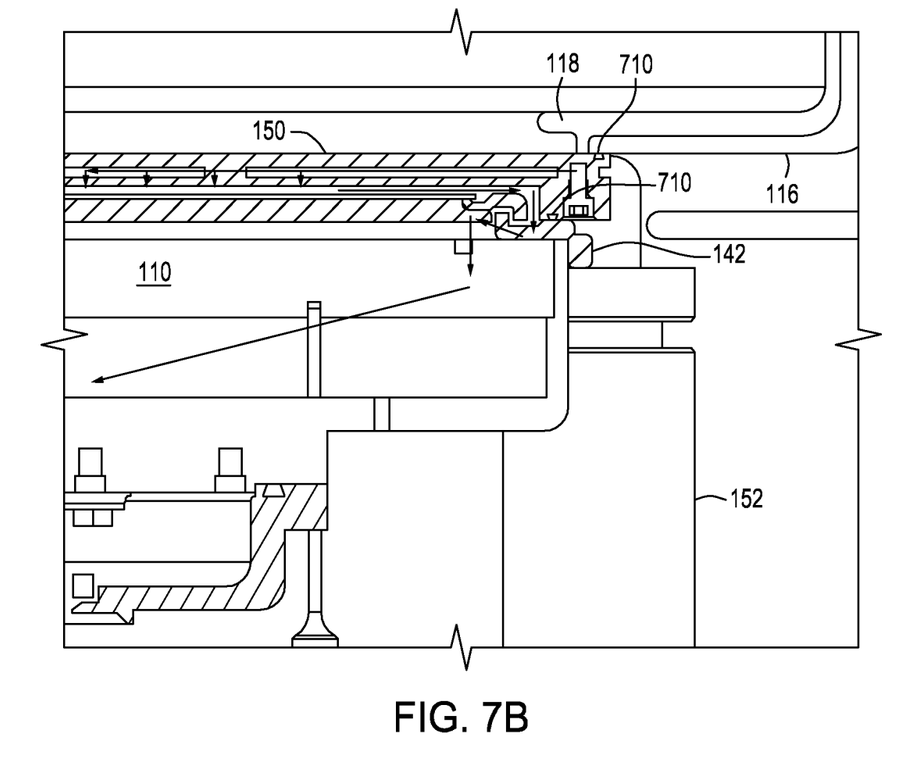

In some embodiments consistent with FIG. 7B, after the shutter disk assembly 150 is placed on the rotating pedestal outer support cover ring 142, the substrate support 110 moves up to form a seal between the shutter disk assembly 150 and the conical shield 118, or conical adaptor 116. In embodiments consistent with both FIGS. 7A and 7B, processing and purge gases may be flowed through conduits 702 formed in the substrate support 110 which is coupled to one or more inlet conduits on the shutter disk assembly 150.

Figure 8:
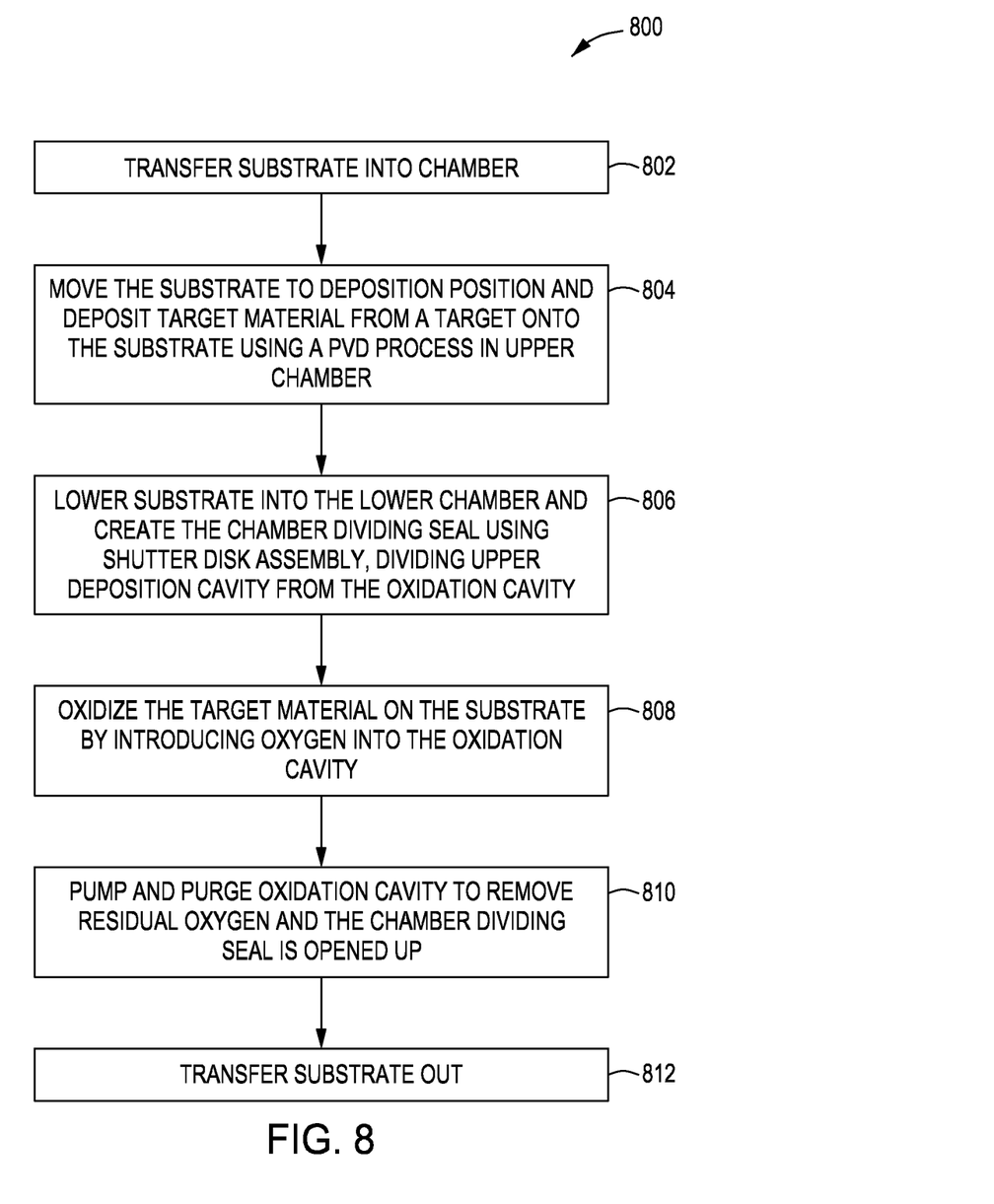
FIG. 8 is a flowchart of a of a process performed by the internally divisible substrate processing chambers in accordance with some embodiments of the present disclosure.

FIG. 8 is a flowchart of at least one embodiment of a process 800 performed by the internally divisible substrate processing chambers described herein. The method begins at 802 where a substrate 108 is transferred into chamber 100 using a robotic arm mechanism. As 804, the substrate 108 is moved to deposition position and mg is deposited from a target onto the substrate 108 using a PVD process in upper chamber 102. At 806, the substrate is lowered into the lower chamber 104 and the chamber dividing seal is created using shutter disk assembly 150, dividing upper deposition cavity 130 from the oxidation cavity 132. At 808, oxidation of the mg on the substrate occurs by introducing oxygen into the oxidation cavity 132. At 810, the oxidation cavity 132 is pumped and purged to remove residual oxygen and the chamber dividing seal is opened up. If additional layers are desired, steps 804-810 are repeated until desired MgO layer thickness and other properties are achieved. At 812, the substrate is transferred out of chamber and the process ends.

While the foregoing is directed to embodiments of the present disclosure, other and further embodiments of the disclosure may be devised without departing from the basic scope thereof.

The invention claimed is:

1. An internally divisible process chamber, comprising:
an upper chamber portion having a conical shield, a conical adaptor, a cover ring, and a target;
a lower chamber portion having a substrate support having inner and outer deposition rings, and wherein the substrate support is vertically movable; and
a shutter disk assembly configured to internally divide the process chamber and create a separate sealed deposition cavity and a separate sealed oxidation cavity, wherein the shutter disk assembly includes one or more seals disposed along its outer edges and configured to contact at least one of the conical shield, the conical adaptor, or the deposition rings to form the separate sealed deposition and oxidation cavities,
wherein the shutter disk assembly includes an upper seal that forms a seal between the shutter disk assembly and a lower lip of the conical adaptor to create the separate sealed deposition and oxidation cavities, and
wherein the shutter disk assembly includes a lower seal that forms a seal between the shutter disk assembly and the outer deposition ring to create the separate sealed deposition and oxidation cavities.

2. The internally divisible process chamber of claim 1, wherein a third cavity is formed when the upper seal of the shutter disk assembly is in contact with the lower lip of the conical adaptor and the lower seal of the shutter disk assembly is in contact with the outer deposition ring.

3. The internally divisible process chamber of claim 2, wherein the substrate support is configured to move vertically to enable contact between the lower seal of the shutter disk assembly and the outer deposition ring.

4. An internally divisible process chamber, comprising:
an upper chamber portion having a conical shield, a conical adaptor, a cover ring, and a target;
a lower chamber portion having a substrate support having inner and outer deposition rings, and wherein the substrate support is vertically movable; and
a shutter disk assembly configured to internally divide the process chamber and create a separate sealed deposition cavity and a separate sealed oxidation cavity, wherein the shutter disk assembly includes one or more seals disposed along its outer edges and configured to contact at least one of the conical shield, the conical adaptor, or the deposition rings to form the separate sealed deposition and oxidation cavities,
wherein the shutter disk assembly includes an upper seal that forms a seal between the shutter disk assembly and a lower lip of the conical shield to create the separate sealed deposition and oxidation cavities, and
wherein the shutter disk assembly includes a lower seal that forms a seal between the shutter disk assembly and the outer deposition ring to create the separate sealed deposition and oxidation cavities.

5. The internally divisible process chamber of claim 4, wherein a third cavity is formed when the upper seal of the shutter disk assembly is in contact with the lower lip of the conical shield and the lower seal of the shutter disk assembly is in contact with the outer deposition ring.

6. An internally divisible process chamber, comprising:
an upper chamber portion having a conical shield, a conical adaptor, a cover ring, and a target;
a lower chamber portion having a substrate support having inner and outer deposition rings, and wherein the substrate support is vertically movable; and
a shutter disk assembly configured to internally divide the process chamber and create a separate sealed deposition cavity and a separate sealed oxidation cavity, wherein the shutter disk assembly includes one or more seals disposed along its outer edges and configured to contact at least one of the conical shield, the conical adaptor, or the deposition rings to form the separate sealed deposition and oxidation cavities,
wherein the lower chamber portion includes a robot transfer assembly having a transfer arm and a rotatable shaft configured to move the shutter disk assembly into the internally divisible process chamber through a shutter disk opening in the chamber.

7. The internally divisible process chamber of claim 6, wherein a first gas conduit is disposed within the rotatable shaft of the robot transfer assembly, and a second gas conduit disposed in the transfer arm that is fluidly coupled to the first gas conduit and to a shutter disk assembly showerhead configured to introduce oxidation gases into the oxidation cavity.

8. The internally divisible process chamber of claim 6, wherein the robot transfer assembly is configured to move vertically to enable contact between an upper seal of the shutter disk assembly and the conical adapter or conical shield.

9. An internally divisible process chamber, comprising:
an upper chamber portion having a conical shield, a conical adaptor, a cover ring, and a target;
a lower chamber portion having a substrate support having inner and outer deposition rings, and wherein the substrate support is vertically movable; and
a shutter disk assembly configured to internally divide the process chamber and create a separate sealed deposition cavity and a separate sealed oxidation cavity, wherein the shutter disk assembly includes one or more seals disposed along its outer edges and configured to contact at least one of the conical shield, the conical adaptor, or the deposition rings to form the separate sealed deposition and oxidation cavities,
wherein the shutter disk assembly includes a showerhead, and wherein a first gas conduit is fluidly coupled directly to the showerhead of the shutter disk assembly and configured to introduce Oxygen ($O_2$) into the oxidation cavity.

10. The internally divisible process chamber of claim 1, wherein the lower chamber portion includes one or more chamber-mounted actuators configured to lift the shutter disk assembly and form a seal between the shutter disk assembly and the conical adapter or conical shield.

11. The internally divisible process chamber of claim 10, wherein the lower chamber portion includes three chamber-mounted actuators configured to ensure the shutter disk assembly is held level and forms a proper seal with the conical adapter or conical shield.

12. The internally divisible process chamber of claim 1, wherein the shutter disk assembly is a flat plate having one or more seal disposed on a top surface to from the seal with the conical adapter or conical shield.

13. An internally divisible process chamber, comprising:
an upper chamber portion having a conical shield, a conical adaptor, a cover ring, and a target;

a lower chamber portion having a substrate support having inner and outer deposition rings, and wherein the substrate support is vertically movable; and a shutter disk assembly configured to internally divide the process chamber and create a separate sealed deposition cavity and a separate sealed oxidation cavity, wherein the shutter disk assembly includes one or more seals disposed along its outer edges and configured to contact at least one of the conical shield, the conical adaptor, or the deposition rings to form the separate sealed deposition and oxidation cavities, wherein the shutter disk assembly is a gas distribution showerhead assembly comprising a top plate and a bottom plate with a gas distribution disk disposed between them.

14. The internally divisible process chamber of claim 13, wherein the bottom plate includes a central opening and a lip on which the gas distribution disk is disposed on and is retained within.

15. The internally divisible process chamber of claim 13, wherein the gas distribution disk includes a plurality of gas distribution holes coupled to one or more channels, wherein at least one of the channels formed in the gas distribution disk is coupled to a second channel formed in either the top plate or the bottom plate which is further coupled to a gas source.

* * * * *